US008870472B2

(12) United States Patent
Oggioni et al.

(10) Patent No.: US 8,870,472 B2
(45) Date of Patent: Oct. 28, 2014

(54) COMPUTER PROGRAM PRODUCT FOR ELECTRO-OPTICAL ASSEMBLY

(71) Applicant: International Business Machines Corporation, Armonk, NY (US)

(72) Inventors: Stefano Sergio Oggioni, Milan (IT); Jonas R. Weiss, Rueschlikon (CH); Bert Jan Offrein, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/676,376

(22) Filed: Nov. 14, 2012

(65) Prior Publication Data
US 2013/0067739 A1 Mar. 21, 2013

Related U.S. Application Data

(62) Division of application No. 12/876,543, filed on Sep. 7, 2010, now Pat. No. 8,444,328.

(30) Foreign Application Priority Data

Dec. 11, 2009 (EP) .................................. 9178913

(51) Int. Cl.
| G02B 6/36 | (2006.01) |
| G02B 6/13 | (2006.01) |
| H05K 1/18 | (2006.01) |
| H05K 1/02 | (2006.01) |
| H05K 13/00 | (2006.01) |
| G02B 6/43 | (2006.01) |
| G02B 6/42 | (2006.01) |
| G02B 6/38 | (2006.01) |
| H05K 3/34 | (2006.01) |

(52) U.S. Cl.
CPC ............. *G02B 6/13* (2013.01); *G02B 6/4214* (2013.01); *H05K 1/189* (2013.01); *H05K 1/0274* (2013.01); *G02B 6/3885* (2013.01); *H05K 2201/10121* (2013.01); *H05K 2201/09081* (2013.01); *H05K 13/00* (2013.01); *H05K 2203/0195* (2013.01); *H05K 2201/10674* (2013.01); *H05K 3/3405* (2013.01); *H05K 1/184* (2013.01); *G02B 6/43* (2013.01)
USPC ............. 385/93; 385/33; 29/592.1; 29/603.1

(58) Field of Classification Search
USPC .............. 385/14, 33, 43, 93; 29/592.1, 603.1, 29/709, 721; 710/20, 29, 36, 58–59
See application file for complete search history.

(56) References Cited

U.S. PATENT DOCUMENTS

| 5,005,029 A | * | 4/1991 | Fuse ............................ 347/238 |
| 5,091,045 A | | 2/1992 | Froning et al. |

(Continued)

FOREIGN PATENT DOCUMENTS

| JP | 2002050643 | 2/2002 |
| JP | 2008041772 | 2/2008 |
| JP | 2009135295 | 6/2009 |

OTHER PUBLICATIONS

I. Papakonstantinou et al., "Low-Cost, Precision, Self-Assignment Technique for Coupling Laser and Photodiode Arrays to Polymer Waveguide Arrays on Multilayer PCBs," IEEE Techniques on Advanced Packaging, Vo. 31, No. 3, Aug. 2008, pp. 502-511.

(Continued)

*Primary Examiner* — Minh Trinh
(74) *Attorney, Agent, or Firm* — Thomas E. Tyson; Damion C. Josephs (57) ABSTRACT

A computer program product for fabricating an optical assembly, having a computer readable storage medium having computer readable program code embodied therewith, the computer readable program code includes a first computer readable program code configured to horizontally position a flexible portion of a substrate including a waveguide, the waveguide exposed at one end edge of the substrate; a second computer readable program code configured to bend the flexible portion of the substrate to place the waveguide exposed end in approximately a vertical position; a third computer readable program code configured to vertically position a flip-chip bonder bond head containing an optical component upon the waveguide exposed substrate edge to optically mate the optical component with the exposed waveguide; and a fourth computer readable program code configured to fixably mount the optical component to the substrate edge.

2 Claims, 11 Drawing Sheets

(56) References Cited

U.S. PATENT DOCUMENTS

| | | |
|---|---|---|
| 5,216,729 A | 6/1993 | Berger et al. |
| 6,834,133 B1 | 12/2004 | Towle et al. |
| 6,879,032 B2 | 4/2005 | Rosenau et al. |
| 6,932,521 B2 | 8/2005 | Campbell et al. |
| 7,035,521 B2 | 4/2006 | Monson et al. |
| 7,242,840 B1 | 7/2007 | Monson et al. |
| 7,336,864 B2 | 2/2008 | Dellmann et al. |
| 7,372,120 B1 | 5/2008 | Towle et al. |
| 7,454,098 B1 | 11/2008 | Lamprecht et al. |
| 8,444,328 B2 * | 5/2013 | Oggioni et al. ............ 385/93 |
| 8,650,316 B2 * | 2/2014 | Thomas ................... 709/229 |
| 8,650,354 B2 * | 2/2014 | Benhase et al. ........... 711/103 |

OTHER PUBLICATIONS

Y. Kumano et al., "Development of chip-on-flex suing SBB flip-chip technology," Microelectronics Reliability 41 (2001), pp. 525-530.

B. Zou et al., "Design and Reliability Study for Flip Chip Applications on Ultra-Thin Flexible Substrates Using NanoPierce Connection System Technology," 2002 International Symposium on Microelectronics, pp. 818-824.

* cited by examiner

COMPUTER PROGRAM PRODUCT FOR ELECTRO-OPTICAL ASSEMBLY

CROSS REFERENCE TO RELATED APPLICATIONS

This application is a divisional of, and claims benefit of the filing date of, co-pending U.S. patent application Ser. No. 12/876,543 entitled "ELECTRO-OPTICAL ASSEMBLY FABRICATION," filed Sep. 7, 2010 now U.S. Pat. No. 8,444,328.

RELATED APPLICATION

This patent claims the benefit of the priority date of a prior foreign application filed under 35 U.S.C. §119, EPO application number EP09178913.1 filed on Dec. 11, 2009 and entitled "Method of Fabrication of an Optical Assembly and Hardware Adapted therefore" which is herein incorporated by reference in its entirety.

BACKGROUND OF THE INVENTION

1. Technical Field

The present invention relates to the manufacturing of optical subassemblies and modules.

2. Description of the Related Art

For the manufacturing of optical subassemblies and modules, which comprise standard VCSELs (vertical cavity surface emitting laser) and Photodiodes, one of the main challenges is the very precise alignment of these devices with respect to the light carrying medium (i.e. fibres or waveguides). For optical multi-mode applications, that is, where multiple optical modes propagate through the fibres/waveguides, potentially at different speeds, leading to pulse-distortion at higher data-rates, mechanical alignment accuracies in the order of 5 μm (micrometers) are required.

Many concepts have been proposed in the past, e.g. using passive alignment with different types of packages or optical subassemblies. Very few of them ever made it into a product, mostly because of large scale manufacturing problems and high cost. Independent of the concept used is the fact that no matter what, at one moment in time the electro-optical components must be aligned with the required accuracy with respect to either a package, board or a subassembly.

With the constant increase of data-rates and "bandwidth", new generations of systems are carefully considering the need to migrate to optical transmission to meet product performance targets. So far the limiting factor has been the cost of producing affordable optical transceiver assemblies which convert electrical signals into optical pulses and on the other end of the signal path to reconvert optical inputs back into electrical signals. Integration of rigid structures or even the uses of fibre bundles are complex and cumbersome to the overall system architecture.

U.S. Pat. No. 7,336,864 describes an opto-electronic board including a printed wiring board with an optical waveguide, a metallic area, and a hole, wherein an abutting face of the optical waveguide and an abutting face of the metallic area form a part of the side face of the hole. The opto-electronic board further comprises an opto-electronic circuit with a bonding pad, wherein the opto-electronic circuit is arranged in the hole and soldered with its bonding pad to the abutting face of the metallic area.

SUMMARY

In accordance with the present invention, a method is provided to fabricate an optical assembly by horizontally positioning a flexible portion of a substrate including a waveguide, the waveguide exposed at one end edge of the substrate, bending the flexible portion of the substrate to place the waveguide exposed end in approximately a vertical position, vertically positioning a flip-chip bonder bond head containing an optical component upon the waveguide exposed substrate edge to optically mate the optical component with the exposed waveguide; and fixably mounting the optical component to the substrate edge.

In a preferred embodiment of the present invention, a method is provided for fabricating an optical assembly by placing a flexible portion of a substrate including a waveguide upon a horizontally movable stage of a flip-chip bonder, the waveguide exposed at one end edge of the substrate wherein the stage includes an opening positioned underneath the substrate exposed end edge, vertically upwardly moving a clamp through the stage opening to bend the flexible portion of the substrate to place the waveguide exposed end in approximately a vertical position, vertically downwardly moving a bond head containing an optical component upon the waveguide exposed substrate edge to position the optical component with the exposed waveguide, fixably mounting the optical component to the substrate edge, and releasing the optical component from the bond head while moving the clamp vertically downward through the stage opening to unbend the flexible portion of the substrate with the optical component mounted.

BRIEF DESCRIPTION OF THE DRAWINGS

Embodiments of the present invention will now be described by way of example with reference to the accompanying drawings in which like references denote similar elements, and in which.

DETAILED DESCRIPTION

As described above, the precise placement of electro-optical components is a critical issue.

Organic optical waveguides on electrical flexible substrates with electrical fine-pitch conductor technologies can be used as an alternative to build the interface between electrical circuits and optical data-transport-media (e.g. fibres or other waveguides).

With the specific aim of create a path of easy integration of optics into IT Systems The use of cheap processes to build electro-optical "flexible" modules is a very powerful tool.

Typically, components are assembled to electrical flex-circuits while they're still flat. Only after assembly, the flex circuits are deformed to meet very special spatial requirements (e.g. to "re-orient" optical components, pressure sensors, microphones, or just to tightly pack components into 3-D like assemblies).

Figure 1:
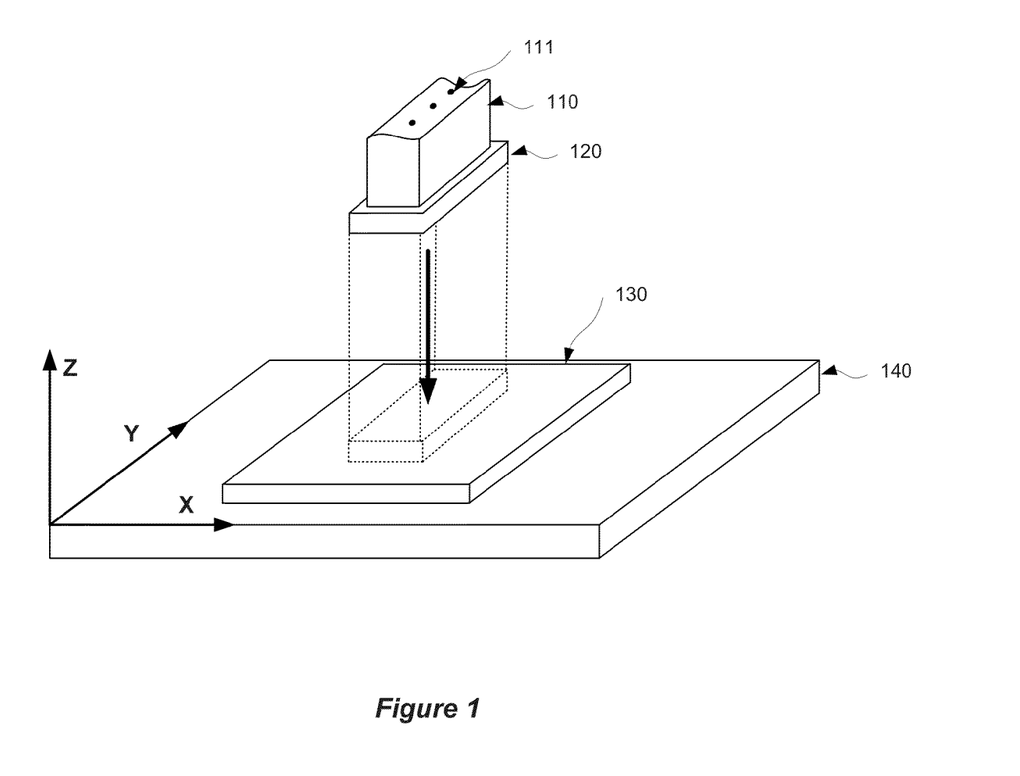
FIG. 1 shows a typical flip-chip bonder installation not belonging to the present invention.

FIG. 1 shows a typical flip-chip bonder installation for flat mounting and not belonging to the present invention. As shown, there is provided a substrate 130 upon which a flip-chip component 120 is to be installed. The flip-chip bonder itself comprises bond head 110 and X-Y stage 140. The substrate 130 is mounted on the X-Y stage 140, which is adapted to coarsely position the substrate in the x-y plane. The flip-chip component 120 meanwhile is held by bond head 110. The bond head 110 is mounted for precise movement in the z-axes. As shown, the bond head is provided with airtight channels 111 which in use contain a partial vacuum, thereby retaining the flip-chip component in position on the die head. The bond head 110 and X-Y stage 140 are moved so as to precisely align the substrate 130 and flip-chip component 120 in the desired relationship, and then the bond-head is moved in the z axis so as to bring the flip-chip component into contact with the substrate 130 such that optical apertures on the flip-chip component 130 are exactly aligned with corresponding apertures of the waveguides. The flip-chip component 120 is then bonded to the substrate 130 by any one of a number of standard techniques such as use of thermal curing glue, use of UV curing glue, use of rapidly curing glue etc. The bond head 110 then pressurises the channels 111 so as to release the flip-chip component and withdraws.

A standard flip-chip bonder of the kind described above has the required precision to position optical components, and present the further advantage of being readily available and relatively inexpensive. The very high placement accuracy, inherent to flip-chip bonders is used to directly attach optical devices to the optical facet, or terminal of a waveguide or waveguide array and to use the flexible nature of flex-prints to orient the latter in a suitable way to be processed with standard equipment, that is connected to an electro-optical chip die (e.g. a VCSEL or a photodiode) by means of a standard flip-chip bonder. The optical wave-guides are manufactured on either side of the substrate or fully embedded. The expression "optical device" electro-optical component such as for example a Photodiode or VCSEL, or a passive component such as a lens or mirror.

Unfortunately many optical components are intended for mounting in the z-y plane, i.e. at right angles to the plane of the substrate, so as to receive or transmit an optical signal arriving through a waveguide oriented in the plane of the substrate.

Embodiments described herein seek to exploit the intrinsic flexibility of flex-circuits, even before certain components have yet been assembled, i.e. to use the flexibility of the substrate to enable a simpler and higher throughput assembly operation.

FIGS. 2a, 2b, 2c, 2d, 2e and 2f show an optical assembly and flip-chip bonder in different configurations in accordance with a first embodiment of this invention.

Figure 2A:
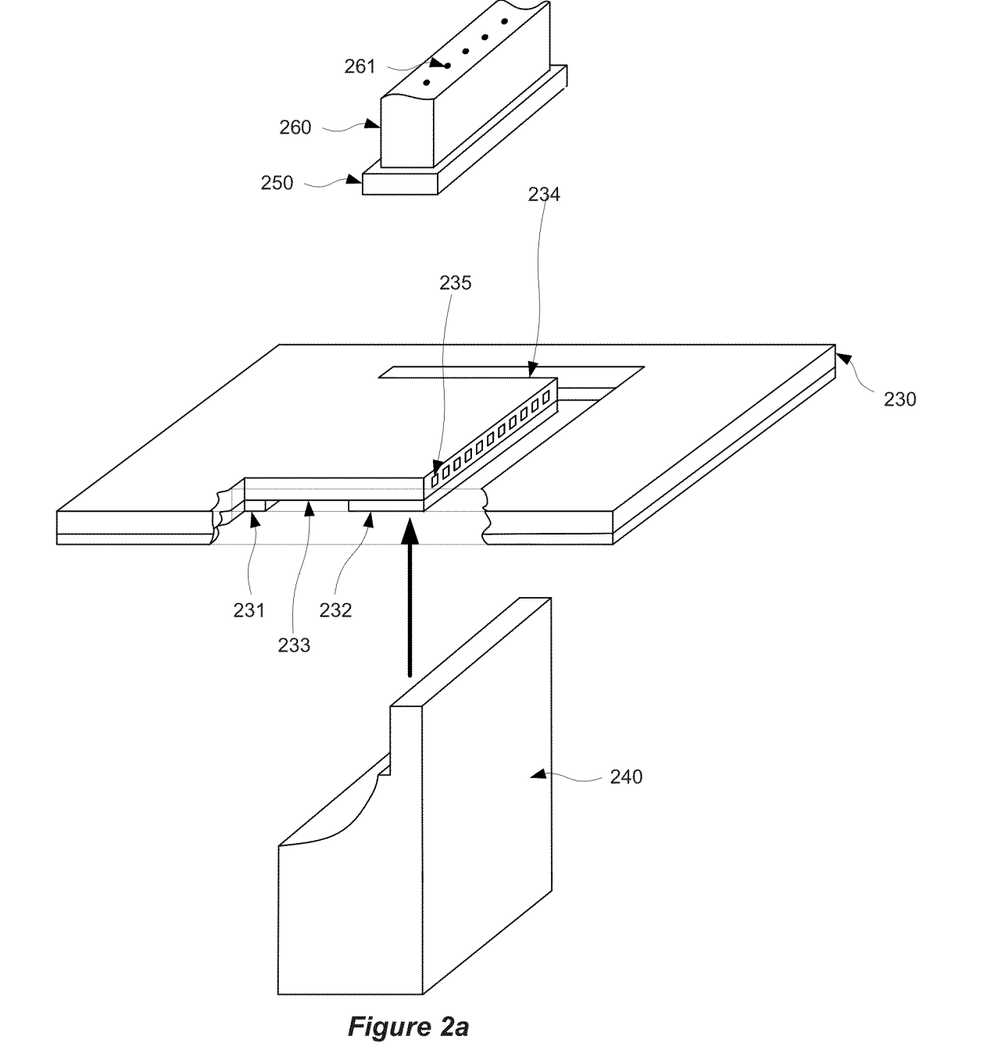
FIGS. 2*a*, 2*b*, 2*c*, 2*d*, 2*e* and 2*f* show an optical assembly and flip-chip bonder in different configurations in accordance with a first embodiment.

As shown in FIG. 2a there is provided a rectangular, planar, flexible substrate 230, comprising one or more waveguides 235. The flexible substrate is provided with a reinforcing layer 231. As shown, a U shaped section is cut out from the substrate 230 to leave a tongue 234 fixed to the substrate at one edge. To guarantee the terminal remain properly aligned (i.e. no warping) and increase the surface available for bonding, a further reinforcing section in the form of a piece of rigid PCB material 232 is added/left underneath the tongue portion 234, but there is provided an un-reinforced, flexible portion 233 extending across the width of the tongue 234.

As a preliminary step, the x-y stage (not shown) positions the planar substrate 230 on the panel underneath the bond-head 260, which as shown includes the optical component 250.

As shown, there is further provided a clamp element 240, situated below the bond head 260, which once the planar substrate 230 is correctly positioned with respect to the x-y plane starts to rise upwards towards the planar substrate 230 and bond head 260 in the z axis.

Figure 2B:
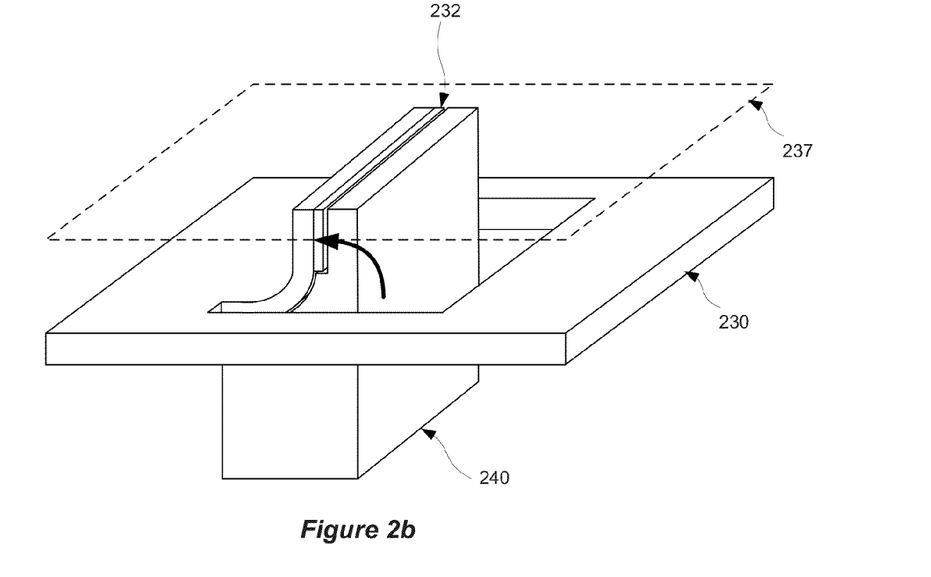

As shown in FIG. 2b, the clamp element 240, has risen upwards to the bond head 260 in the z axis so as to engage the planar substrate 230 and by the pressure exerted thereon has deformed at least a part of the flexible portion, so that the terminal 235 of the waveguide comprised therein is oriented away from the substrate 230 so as to expose the terminal 235. In particular as shown the terminal 235 is positioned in a bonding plane 237 substantially parallel to the plane of the substrate 230, and elevated above it.

The x-y stage (not shown) is formed to permit the passage of the clamp, for example by the provision of an aperture of suitable dimensions.

As shown, the clamp element 240 is shaped so to as to exactly conform to the outer contour of the flexible portion of the planar substrate in its deformed configuration, so as to ensure that the terminal 235 is precisely and securely positioned with respect to the x-y stage, and thereby the bond head 260.

To further avoid undesired deformations of the substrate, the x-y stage and/or the clamping element may be provided with gripping means such as an adhesive or high friction coating, suction cups or vacuum channels, similar to those provided in the bond head.

According to an optional variation of the embodiment of FIG. 2, there may be provided a second clamp element. This second clamp element is preferably shaped so as to exactly conform to the inner contour of the flexible portion, of the planar substrate in its deformed configuration, that is, on the opposite side of the substrate to the first clamp element. By this means, any residual freedom for the terminal to stray from the required position is removed, so as to ensure that the terminal 235 (not shown) is precisely and securely positioned with respect to the x-y stage, and thereby the bond head 260. Where such a second clamp element is provided, it may advantageously be brought into contact with the substrate by sliding in sideways parallel the substrate, or more preferably by arriving obliquely from above so as to clear any components on the substrate surface.

In certain embodiments, the x-y stage and/or the bond-head may also be able to correct angular errors with respect to the orientation of the planar substrate (i.e. tilt and rotation).

Figure 2C:
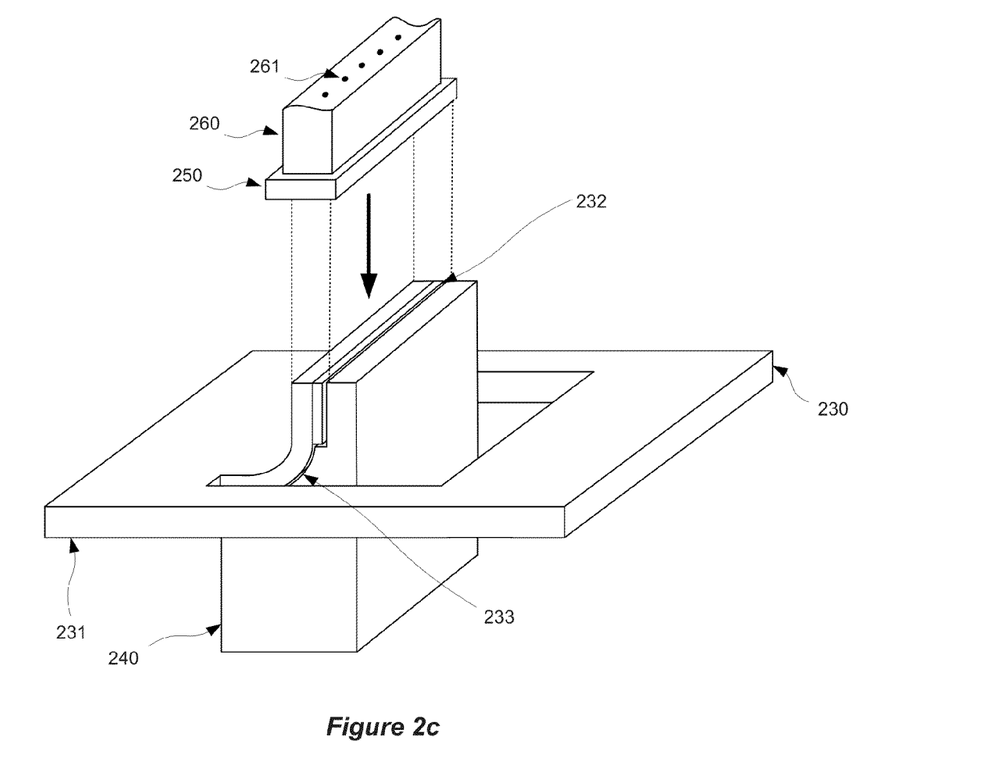
Figure 2D:
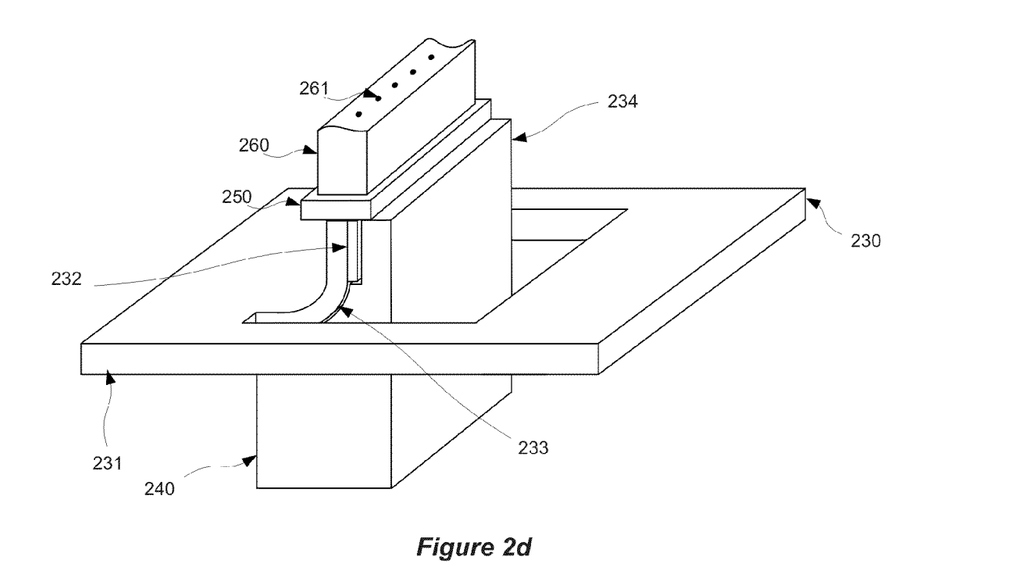

As shown in FIG. 2c, once the terminal 235 (not shown) is correctly positioned with regard to x- and y and θ, t, and where appropriate tilt and rotation, the bond head positions the optical component in the z axis so as to placing the electro-optical component on the waveguide component by means of a flip-chip bonder so as to abut the terminal, as shown in FIG. 2d. The bond head is provided with airtight channels 261 which in use provide a partial vacuum, thereby retaining the flip-chip component in position on the die head as discussed above with respect to FIG. 1.

It is at this stage that the electro-optical component is coupled to the terminal, as described in more detail hereafter.

Figure 2E:
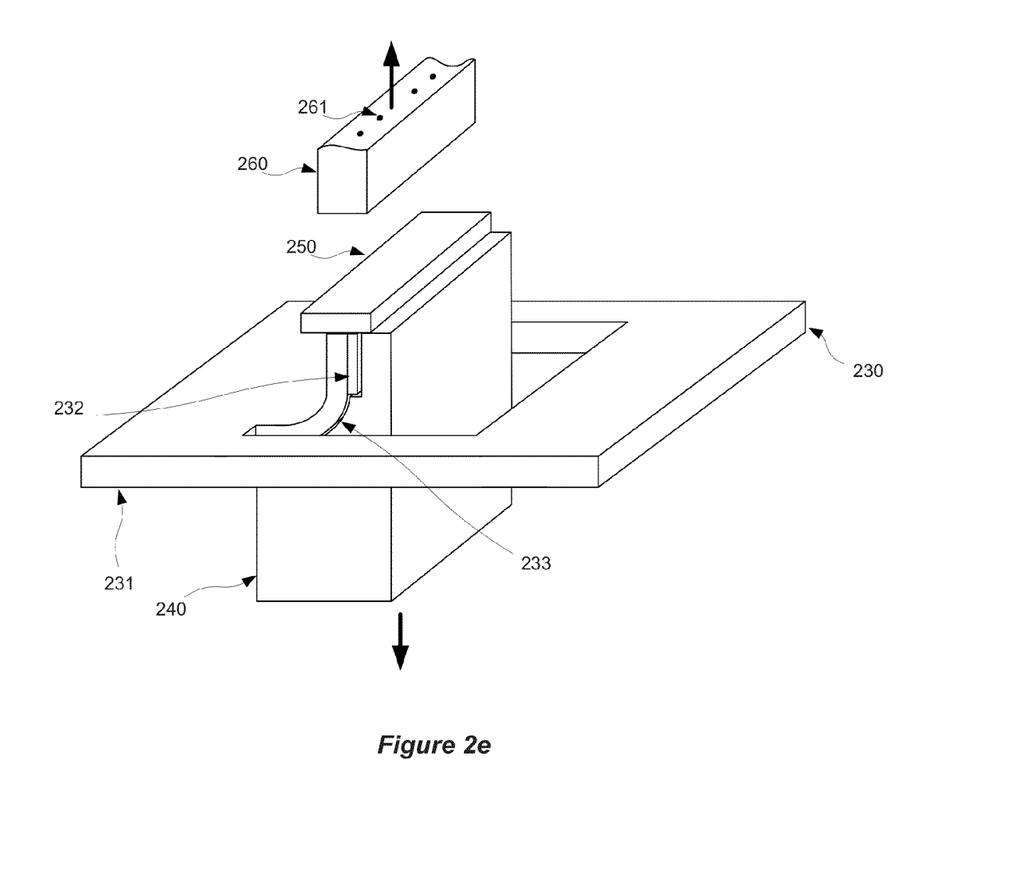
Figure 2F:
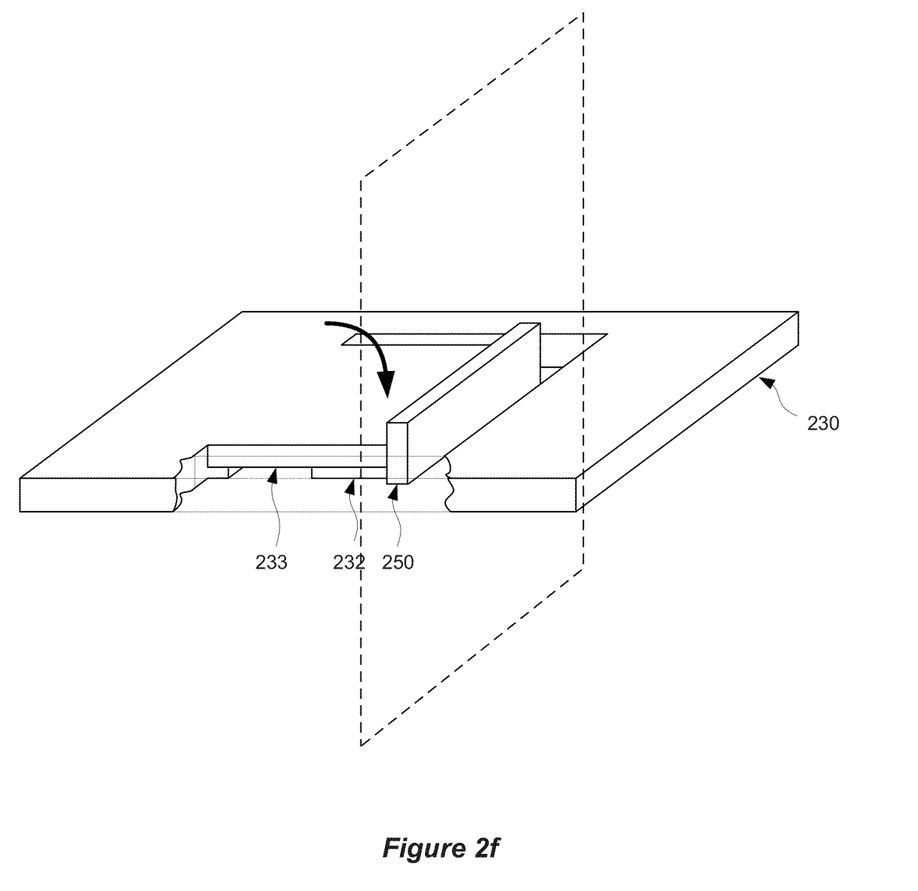

As shown in FIG. 2e, the bond head 260 then pressurises the channels 261 so as to release the optical component 250 and withdraws. Meanwhile, the clamp element 240 is also withdrawn, so that the flexible portion so as to resume its position aligned with the plane of the substrate, as shown in FIG. 2f. This deformation preferably occurs due to the elasticity of the flexible substrate.

FIG. 2f thus shows the optical assembly in its final form, with the optical component 250 positioned so as to receive an optical signal from a waveguide oriented in the plane of the substrate, and to transmit a signal away from that plane, for example at right angles thereto.

It will be appreciated that the configuration of the substrate may be subject to many variations. For example, the reinforcing layer may be omitted altogether, or may take a different form to that described above. The reinforcing layer may include only the main section 231, or the part reinforcing the tip of the tongue 232. The reinforcing layer may be disposed on either or both sides of the flexible substrate. Rather than comprising a cutout defining a tongue 234 as described above, the flexible portion may be a protuberance extending from the edge of the substrate, or indeed the whole width of the flexible substrate may constitute the flexible portion, in which case the deformation strep would involve the bending of the whole substrate across its width.

Figure 3:
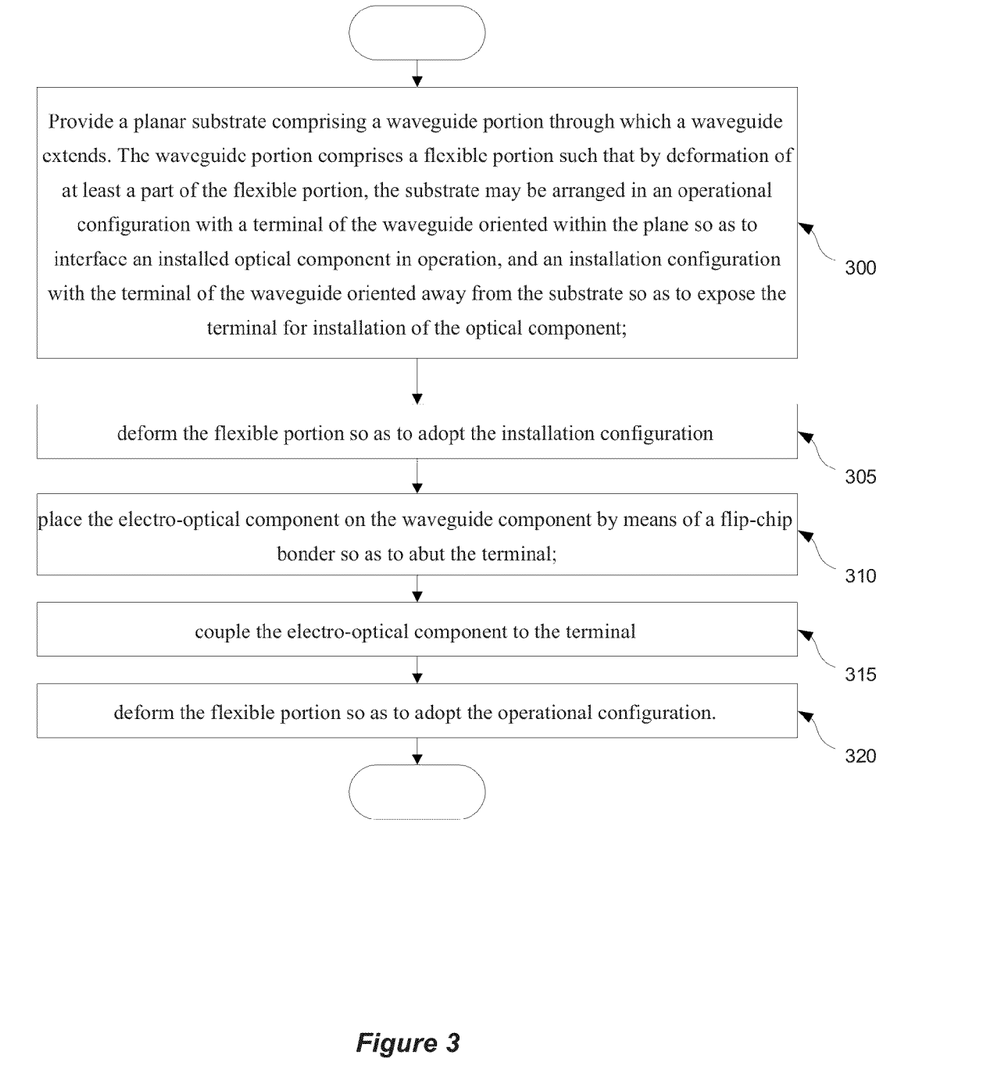
FIG. 3 is a flowchart of the steps of the process described with respect to FIG. 2.

FIG. 3 is a flowchart of the steps of the process described with respect to FIGS. 2a-2f. There is accordingly defined a method for fabricating an optical assembly comprising an optical component. As shown in FIG. 3, the method starts at step 300, at which a planar substrate 230 comprising a waveguide portion 234 through which a waveguide extends is provided. The waveguide portion comprises a flexible portion 233 such that by deformation of at least a part of the flexible portion 233, the substrate 230 may be arranged in an operational configuration with a terminal 235 of the waveguide positioned within the plane so as to interface an installed optical component in operation, and an installation configuration with the terminal of the waveguide oriented away from the substrate so as to expose the terminal 235 for installation of the optical component 250. The method then proceeds to step 305, at which the flexible portion 233 is deformed so as to adopt the installation configuration. The method then proceeds to step 310 at which the electro-optical component placed on the waveguide portion 234 by means of a flip-chip bonder 260 so as to abut the terminal 235. The method then proceeds to step 315 at which the electro-optical component is coupled to the terminal, before finally proceeding to step 320 of deforming the flexible portion so as to adopt the operational configuration.

As described with reference to FIGS. 2a-2f, the waveguide portion preferably comprises a tongue fixed to the substrate at one edge, and wherein the flexible portion 233 extends across the width of the tongue.

As described with reference to FIG. 2b, the installation configuration of the terminal 235 is preferably positioned in a plane substantially parallel to the plane of the substrate.

As described with reference to FIG. 2f, in the operational configuration the terminal is preferably positioned in a plane substantially orthogonal to the plane of the substrate.

As described with reference to FIGS. 2e and 2f, the step of deforming the flexible portion so as to adopt the operational configuration preferably comprises allowing the flexible portion to elastically resume its original configuration.

Coupling

The step of coupling as described above with regard to FIG. 2d may be implemented using a variety of techniques. The term coupling includes the establishment of different types of relationship between the optical component 250 and the terminal and the waveguide portion 234. These relationships may include the mechanical bonding of the optical component 250 to the terminal and/or the waveguide portion 234, the optical coupling of the optical component 250 to the terminal or terminals, and/or the electrical connection of electrical contacts of the optical component 250 to electrical contacts of the wave-guide portion 234. Electrical connections need only be formed where the optical component incorporates electrical circuitry. Different coupling techniques may be envisaged in which two or more of the above kinds of coupling are achieved by the same process. A number of exemplary coupling strategies are described in more detail hereafter; however the skilled person will appreciate that other approaches or different combinations of the described techniques may also be effective.

Figure 4A:
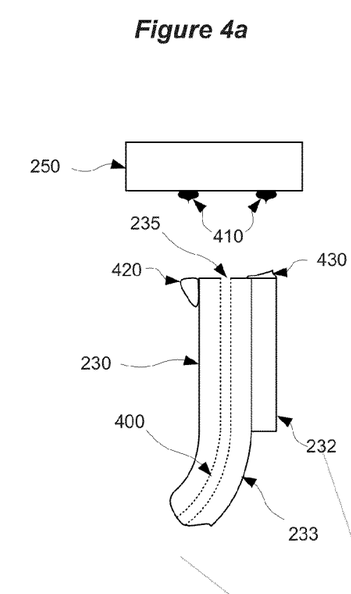
FIGS. 4*a*, 4*b* and 4*c* show a first coupling technique.
Figure 4B:
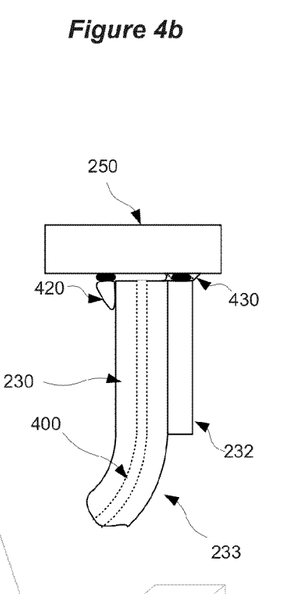
Figure 4C:
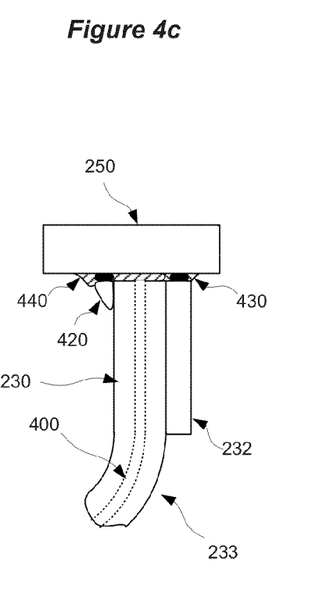

FIGS. 4a, 4b, and 4c show a first coupling technique.

FIGS. 4a, 4b and 4c show an expanded view of the elements of the optical assembly at the interface between the optical component 250 and the substrate 230. In particular, the free end of the flexible portion 234 is shown in the installation configuration, together with the reinforcing part 232. FIG. 4a further shows the waveguide 400, and the terminal 235.

In FIG. 4a, the optical component 250 has not yet been brought into contact with the terminal 235. The optical device and the bond-surface are prepared. The lower surface of the optical component 250 has been provided with a plurality of stand-off bumps 410, which may comprise electrical contacts e.g. Gold-stud-bumps and/or mechanical stand-offs.

On the flexible substrate a fast curing glue (e.g. photosensitive glue) for the mechanical fixation is deposited. To reduce the impact of potential spill-over of this mechanical glue over the optical interface, an optically transparent glue is preferable. The contact material for the electrical contacts (e.g. conductive epoxy) is deposited by e.g. stencil printing. As shown, an electrically conductive glue 420 has been applied to the substrate 230, in electrical contact with conductive tracks embedded in said substrate or disposed on the surface thereof. Still further, an optically curable glue 430 has been applied to the substrate 230 and/or preferably to the reinforcing layer 232.

In FIG. 4b, the optical component 250 has been brought into contact with the substrate, or more precisely certain stand-off pumps 410 mounted the optical component 250 have been brought into contact with the substrate, thereby spacing the optical component itself at a precisely controlled distance from the terminal 235. Certain stand-off bumps 410 are in contact with optically curable glue 430, and others are in contact with the electrically conductive glue 420, so that certain stand-off bumps also form part of the electrical contact between the optical component 250 and the substrate 230. At this stage the glues are cured. By exposure to suitable radiation such as ultra-violet light in the case of optically curable glues, or by exposure to heat in the case of thermally cured glues, or otherwise as appropriate. The optical component is now physically secured to the substrate, and the bond head 260 may withdrawn as described above.

In FIG. 4c, an optical underfill 440 is injected between the electro-optical component 250 and the terminal 235, in the cavity created by the stand-off bumps 410. The optical underfill 440 is then cured. Once cured, the optical underfill optically couples the optical component and the terminal 235, and is thus preferably selected to have suitable transparency and refractive properties to ensure proper transmission of optical signals once cured.

Thus with respect to mechanical coupling, there are accordingly provided steps of applying a glue to the flexible portion in the vicinity of the terminal, wherein the step of placing the electro-optical component comprises bringing the electro-optical component into contact with the glue, and wherein in the step of coupling the electro-optical component to the terminal comprises the further step of physically securing the electro-optical component to the terminal by curing the glue. The glue is preferably substantially transparent, so that in the event of a spill of glue into the vicinity of the terminal, the glue will present a minimal interference to correct signal transmission. The glue is preferably optically curable, since this permits excellent control of the timing of the curing process, without exposing assembly to undesirable thermal or chemical environments.

Thus with respect to electrical coupling, there are accordingly provided steps of providing an interface surface of the electro-optical component with a plurality of stand-off bumps, and of applying an electrically conductive glue to the flexible portion in electrical connection with the terminal, wherein the step of placing the electro-optical component comprises bringing at least one of the stand-off bumps into contact with the electrically conductive glue, and wherein in the step of coupling the electro-optical component to the terminal comprises the further step of electrically connecting the electro-optical component to the terminal by curing the glue. The glue may be a solder, in which case a reflow or other processing method may be appropriate. This step need not be performed on the flip-chip bonder because mechanically the device may already be secured mechanically by the mechanical glue.

Thus with respect to optical coupling, there are accordingly provided steps of injecting and subsequent curing an optical underfill between the electro-optical component and the terminal.

Another approach to establishing electrical coupling may comprises the further steps of bringing at least one of the contacts in close proximity to a corresponding electrical contact on the terminal and depositing an electrically conductive material such as a conductive ink. The deposition of electrically conductive ink may advantageously be achieved by inkjet-printing.

There may optionally be provided cleaning steps. These steps may advantageously be implemented after the mechanical securing of the optical component 250 to the substrate 230, and before the optical interface is sealed by applying an optically transparent underfill material, which also further improves the mechanical attachment/stability.

FIG. 5 shows a second coupling technique.

FIG. 5 shows an expanded view of the elements of the optical assembly at the interface between the optical component 250 and the substrate 230. In particular, the free end of the flexible Portion 234 is shown in the installation configuration, together with the reinforcing part 232. FIG. 5 further shows the waveguide 400, and the terminal 235.

Figures 5A, 5B, 5C:
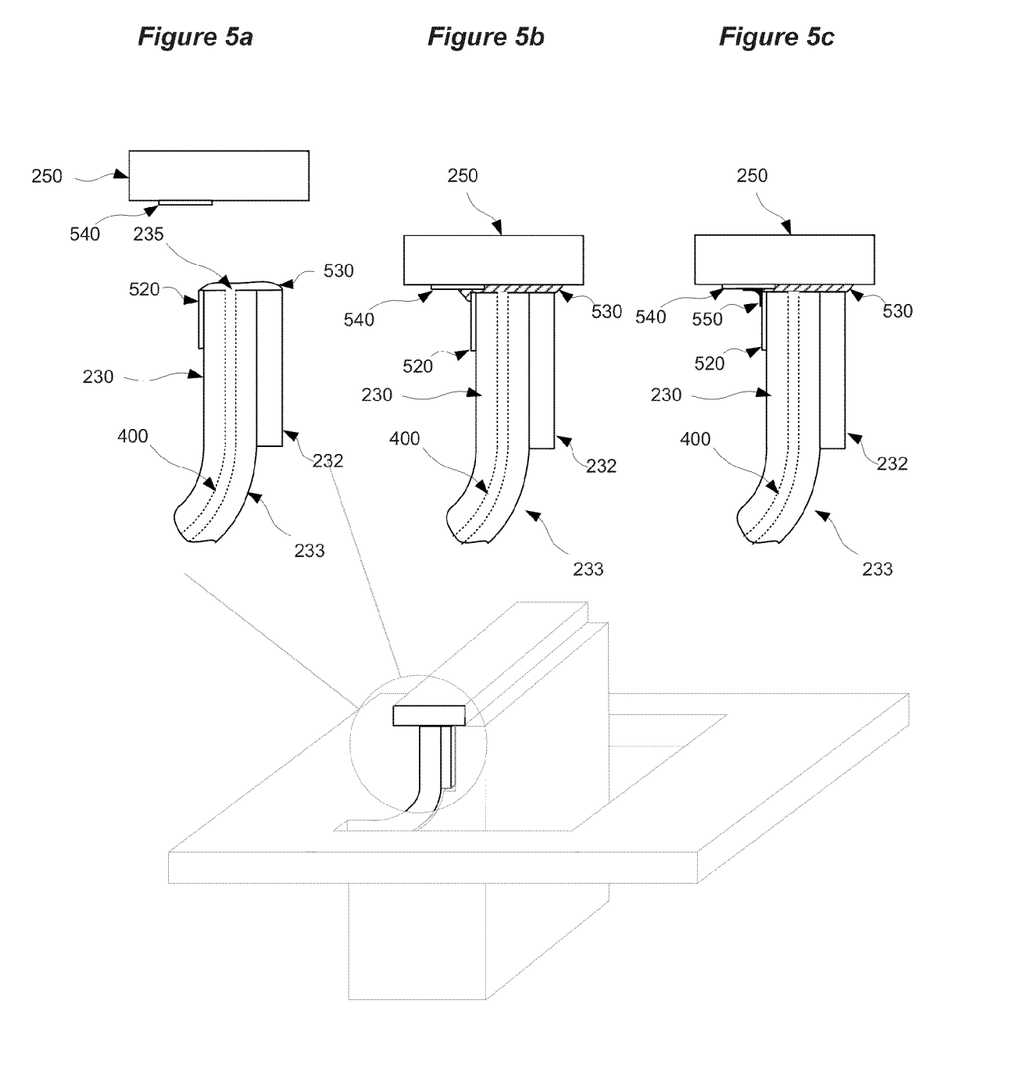
FIGS. 5*a*, 5*b*, and 5*c* show a second coupling technique.

In FIG. 5a, the optical component 250 has not yet been brought into contact with the terminal 235. The optical device and the bond-surface are prepared. The lower surface of the optical component 250 has been provided with electrical conductor contacts 540. The contact material for the electrical contacts (e.g. conductive epoxy) is deposited by e.g. stencil printing.

The upper surface of the flexible substrate 230 has similarly been provided with electrical conductor contacts 520. The contact material for the electrical contacts (e.g. conductive epoxy) are again deposited by e.g. stencils printing. On the flexible substrate a fast curing glue 530 (e.g. photosensitive glue) for the mechanical fixation is deposited. Since this glue also fulfils the role of optical coupling agent, this material must also have suitable optical properties once cured. The fast curing glue may equally be provided either on the optical device or on the substrate or on both.

In FIG. 5b, the optical component 250 has been brought to a precisely controlled distance from the terminal 235, with the glue 530 sandwiched between the substrate and the optical component so as to substantially fill all of the space between the two elements. In fact it is only necessary that contact is made, and that a maximum distance, for example smaller than ~50 microns), is preferably not exceeded. The electrical contacts 540 and 520 are in close proximity, but may be separated by a bead of glue 530 squeezed from between the substrate and the optical component. At this stage the glues are cured, by exposure to suitable radiation such as ultra-violet light in the case of optically curable glues, or by exposure to heat in the case of thermally cured glues, or otherwise as appropriate. The optical component is now physically secured to the substrate, and the bond head 260 may be withdrawn as described above. The bead of glue 530 squeezed from between the substrate and the optical component may be excised by means of a laser or otherwise, so as to leave the electrical contacts 540 and 520 separated by a mere film of glue.

In FIG. 5c, a connecting film of conductive ink or other electrically conductive material 550 is printed for example by means of an inkjet printer so as to brides the gap between electrical contacts 540 and 520.

Figure 6:
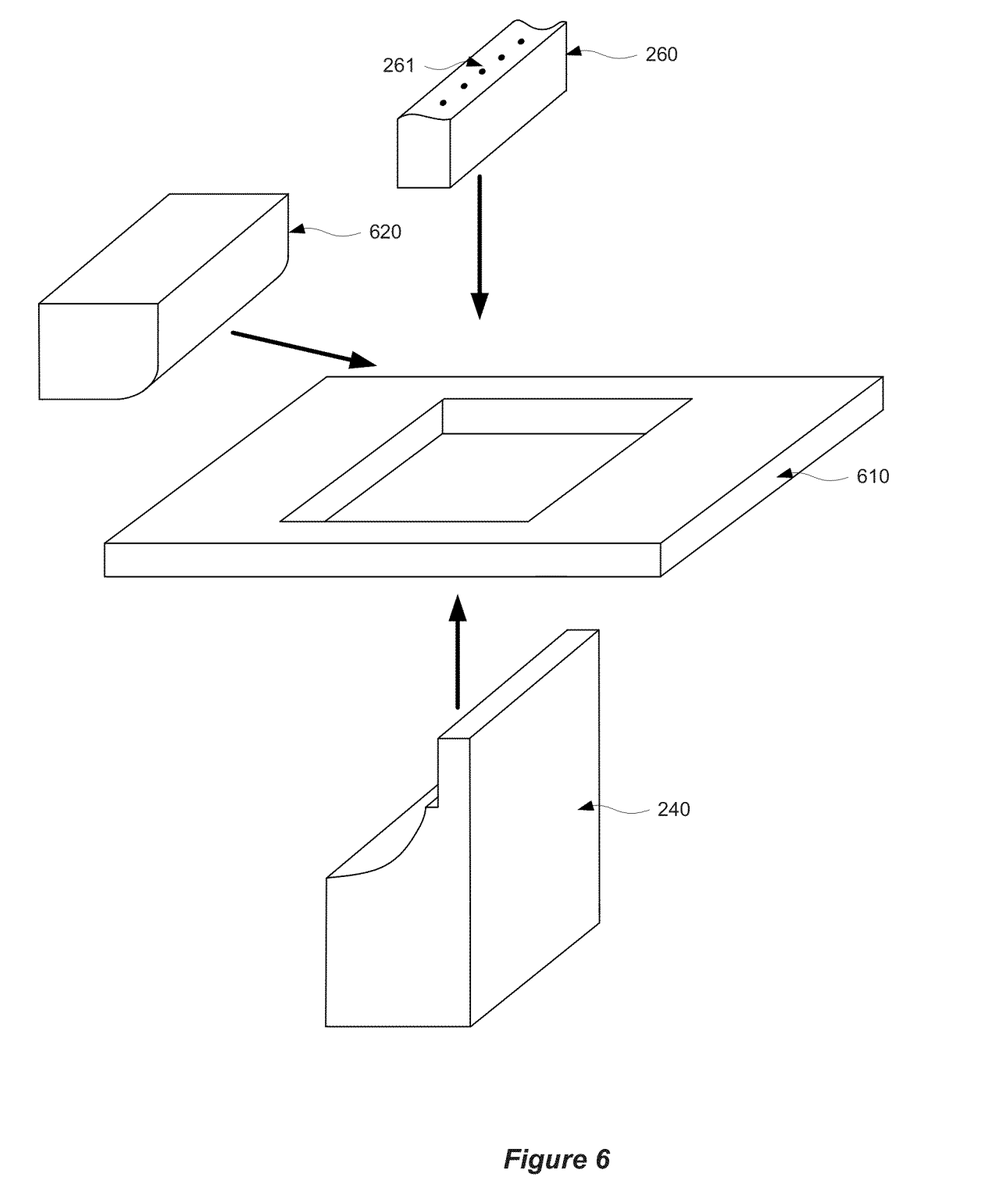
FIG. 6 shows parts of a flip-chip bonder adapted for carrying the steps of the method of FIG. 3.

FIG. 6 shows parts of a flip-chip bonder adapted for carrying the steps of the method of FIG. 3. As shown, the flip-chip bonder comprises a bond head 260 comprising channels 261 as described above, and a lower clamp element 240. The flip-chip bonder further comprises an x-y stage 610, and an upper clamping element 620. The x-y stage is moveable such that a planar substrate mounted thereon can be positioned in the x-y plane with respect to the other components, and is provide with an aperture for the passage of a lower clamp element 240. An optional upper clamp element is articulated so as to move inward the other components being articulated so as to engage the surface of a substrate mounted on the x-y stage, that by trapping the substrate between the upper and lower clamp elements at least a part of a flexible portion deformation of the substrate may be arranged in an installation configuration with the terminal of the waveguide oriented away from the substrate so as to expose the terminal for installation of the optical component, whereupon the bond head 260 is adapted to descend in the z axis to bring an optical component into contact with the substrate.

By withdrawing the bond head and upper and lower clamp elements, the flexible portion is allowed to resume its original configuration.

The flip-chip bonder may additionally be provided with means for the injection or placement of glues or solders for coupling of the optical component to the substrate.

The flip-chip bonder may additionally be provided with means for the curing of glues used in the coupling of the optical component to the substrate, such as ultra-violet lamps or heaters.

As described above, a single optical assembly is formed from a given substrate, by coupling a single optical component thereto. It will be appreciated that a given assembly comprise a plurality of optical components, in which case a corresponding plurality of bond heads, or a specially adapted composite bond head, or a single bond head controlled so as to sequentially place each of the plurality of optical components will be required. It will furthermore be appreciated that a plurality of assemblies may be formed on the same substrate, for later separation, thereby making better use of the relatively large range of travel of the x-y stage.

Figure 7:
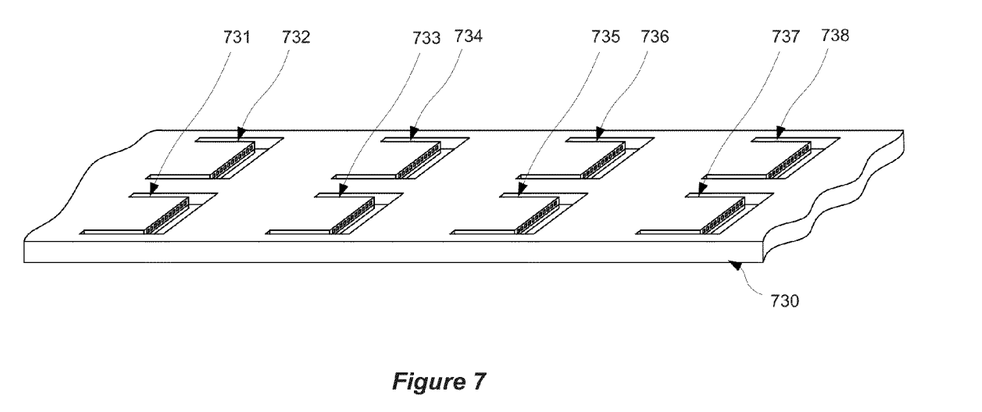
FIG. 7 shows a substrate comprising multiple optical assemblies.

FIG. 7 shows a substrate comprising multiple optical assemblies.

As shown in FIG. 7 there is provided a substrate 730 bearing eight cut-out tongue portions 731 to 738, ready for installation of optical components as described above. The eight cut-out tongue portions 731 to 738 are arranged in a 2×4 matrix. The x-y stage of the flip-chip bonder would preferably be adapted to mirror this configuration, in particular by being sufficiently large to support the entire substrate, and providing an aperture corresponding to each assembly for the passage of the lower clamp element 240 as described above. Such a "panel level assembly" promises to be more efficient and allows for a higher assembly throughput.

Still further, the substrate of FIG. 7 may constitute a continuous web. By further adaptations to the flip-chip bonder it is then possible to produce optical assemblies in a continuous process, rather than the batch process described heretofore.

Figure 8:
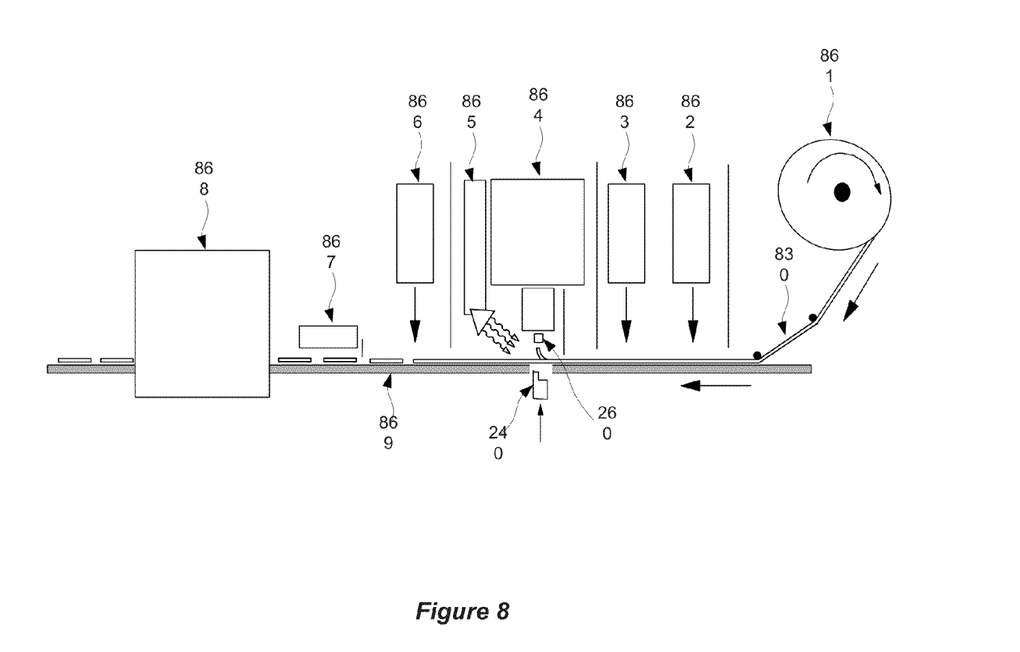
FIG. 8 shows a flip-chip bonder adapted for continuous processing.

FIG. 8 shows a flip-chip bonder adapted for continuous processing.

The flexible waveguide is processed in sequence in different process stations. A continuous reel of flexible substrate 861 is provided. In the place of the x-y stage there is provided a conveyor belt 869, which is provided with regularly spaced aperture for the passage of the lower clamp element 240. Material is drawn from this reel 861 through the various stages of the adapted flip-chip-bonder to produce complete a continuous stream of complete optical assemblies at the output. On leaving the reel, a particular section of substrate material first passes dispensing steps 863 and 862 which in accordance with the foregoing embodiments dispense optical glue for mechanical attachment and optical coupling and electrically conductive glue such as epoxy, respectively.

The substrate material next arrives between the bond head 260 and the lower clamp 240, whereupon the optical component is positioned and coupled as described above. A flash curing station 865 radiates the assembly with a suitable (ultraviolet) radiation to cure optically curable glues etc. as appropriate. The assembly is moved on to a further optical sealing polymer dispenser 866 which dispenses optical underfilling on the case of mechanical stand-offs in accordance with foregoing embodiments, and then cut from the continuous substrate web to form an individual assembly by cutter unit 867. The assembly then passes through an oven 868 for thermal curing of thermally activated glues as appropriate, in particular for the applied optical polymer dispensed by dispenser 866 as well as any other curable glues, e.g. UV curable glues, to which no UV could be applied because they were masked by the components themselves at the earlier step.

This approach makes it possible to manufacture flexible cables of any given length bearing optical and Opto/Electrical conversions at either ends of the cable. Optical Waveguide can be produced of pre-configured customised lengths onto a flexible tape or reel This approach can be highly efficient, since the rough-alignment requirements (i.e. through the part-feeder) is not very high and the fine-adjustments is done by the Flip-chip bonder, which have usually usable path lengths in the order of 25 mm.

By using butt-coupling as described above with regard to the second embodiment, directly to the waveguides with minimum distance between the optical components and the waveguides, it is very likely that the alignment accuracy can be relaxed from ~5 µm to somewhere between 10 to 20 cm.

According to further embodiments, a flip-chip bonder is used to mount optical components including electro-optical components a flexible substrate bearing waveguides by bending a part of the substrate out of its plane so as to expose the waveguide terminals, positioning the optical component on the exposed terminal, bonding it in place and then allowing the substrate to return to its plane. To facilitate this approach the flip-chip bonder may be adapted to incorporate one or more clamp elements to deform the substrate in the appropriate manner to correctly expose and position the terminal. The bonder x-y stage may be provided with an aperture to allow the passage of such clamp elements. A continuous reel process is also provided, capable of producing substrates or cables of any arbitrary length with optical components mounted at either end.

The invention can take the form of an entirely hardware embodiment, as embodied in the flip-chip bonder, an entirely software embodiment as embodied for example in software controlling the flip-chip bonder, or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

Accordingly there is provided a computer program comprising instructions for controlling a flip-chip bonder so as to install an optical component in an optical assembly, said assembly comprising:

a planar substrate-comprising a waveguide portion through which a waveguide extends, said waveguide portion comprising a flexible portion such that by deformation of at least a part of the flexible portion, the substrate may be arranged in an operational configuration with a terminal of the waveguide oriented within the plane so as to interface an installed optical component in operation, and an installation configuration with the terminal of the waveguide oriented away from the substrate so as to expose the terminal for installation of the optical component, said computer program causing said flip-chip bonder suitably coupled to a computer executing said program to implement the steps of:

deforming the flexible portion so as to adopt the installation configuration;

placing the electro-optical component on the waveguide component by means of a flip-chip bonder so as to abut the terminal;

coupling the electro-optical component to the terminal; and deforming the flexible portion so as to adopt the operational configuration.

The computer may of course be embedded in the flip-chip, bonder, or be a stand alone computer coupled to the flip-chip bonder by any appropriate means, for example via an Ethernet or wireless network connection, USB, Bluetooth etc as appropriate.

Figure 9:
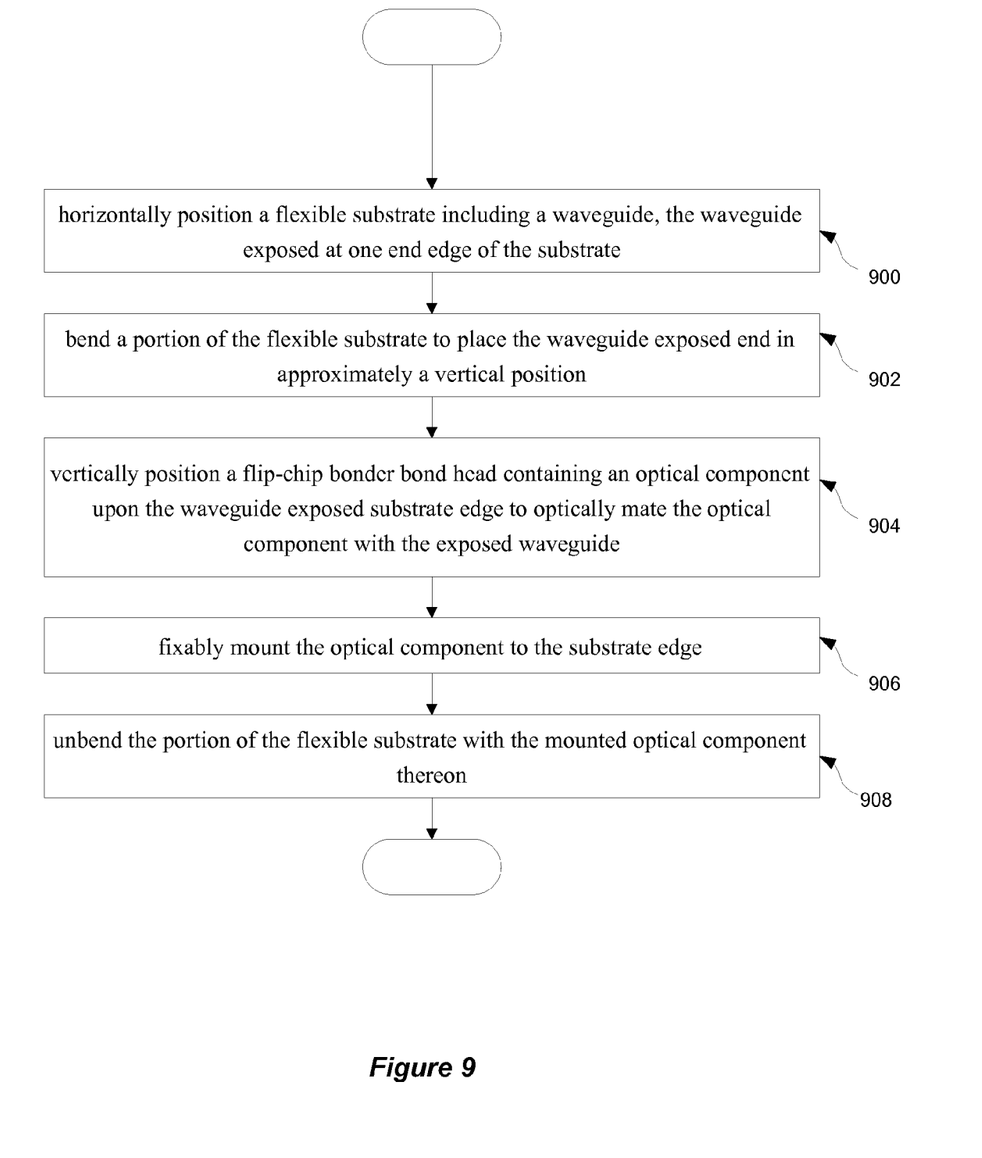
FIG. 9 is a flowchart of the computer program product for fabricating an optical assembly.

Accordingly there is provide a computer program product comprising instructions for controlling a flip-chip bonder so as to install an optical component in an optical assembly, the computer program product providing:

a computer readable storage medium having computer readable program code embodied therewith, the computer readable program code comprising;

first computer readable program code configured to horizontally position a flexible portion of a substrate including a waveguide, the waveguide exposed at one end edge of the substrate (as shown in FIG. 9, step 900);

second computer readable program code configured to bend the flexible portion of the substrate to place the waveguide exposed end in approximately a vertical position (as shown in FIG. 9, step 902);

third computer readable program code configured to vertically position a flip-chip bonder bond head containing an optical component upon the waveguide exposed substrate edge to optically mate the optical component with the exposed waveguide (as shown in FIG. 9, step 904);

fourth computer readable program code configured to fixably mount the optical component to the substrate edge (as shown in FIG. 9, step 906): and a fifth computer readable program code configured to unbend the flexible portion of the substrate with the mounted optical component thereon (as shown in FIG. 9, step 908).

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be implemented substantially concurrently, or the blocks may sometimes be implemented in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While particular embodiments of the present invention have been shown and described, it will be obvious to those skilled in the art that based upon the teachings herein, that changes and modifications may be made without departing from this invention and its broader aspects. Therefore, the appended claims are to encompass within their scope all such changes and modifications as are within the true sprit and scope of this invention. Furthermore, it is to be understood that the invention is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use in the claims of definite articles.

The invention claimed is:

1. A computer program product for fabricating an optical assembly, the computer program product comprising:

a computer readable storage medium having computer readable program code embodied therewith, the computer readable program code comprising;

first computer readable program code configured to horizontally position a flexible portion of a substrate including a waveguide, the waveguide exposed at one end edge of the substrate;

second computer readable program code configured to bend the flexible portion of the substrate to place the waveguide exposed end in approximately a vertical position;

third computer readable program code configured to vertically position a flip-chip bonder bond head containing an optical component upon the waveguide exposed substrate edge to optically mate the optical component with the exposed waveguide; and  fourth computer readable program code configured to fixably mount the optical component to the substrate edge.

2. A computer program product according to claim 1 further including a fifth computer readable program code configured to unbend the flexible portion of the substrate with the mounted optical component thereon.

\* \* \* \* \*